United States Patent [19]
Hamilton

[11] Patent Number: 6,100,835
[45] Date of Patent: Aug. 8, 2000

[54] MULTI-SYMBOL ANALYSIS FOR DIGITAL SYMBOL DETERMINATION

[75] Inventor: Peter A. Hamilton, London, United Kingdom

[73] Assignee: Spacecode LLC, Monmouth, Oreg.

[21] Appl. No.: 09/151,371

[22] Filed: Sep. 10, 1998

[51] Int. Cl.$^7$ .................................................. H03M 1/12
[52] U.S. Cl. ............................................................ 341/155
[58] Field of Search ........................... 341/155; 375/222, 375/147, 150, 341, 376, 242, 44, 144

[56] References Cited

U.S. PATENT DOCUMENTS

| | | |
|---|---|---|
| 5,777,892 | 6/1998 | Nabity et al. ............................ 364/510 |
| 6,030,345 | 2/2000 | Wang ....................................... 600/454 |

*Primary Examiner*—Howard L. Williams
*Assistant Examiner*—Jean B. Jeanglaude
*Attorney, Agent, or Firm*—Ipsolon LLP

[57] ABSTRACT

A multi-symbol analysis process compensates for inter-symbol interference in communication signals. The multi-symbol analysis process determines a digital value for a symbol represented by a selected symbol period by correlating a digitized sample within the selected symbol period with a sum of weighted signal components. The sum of weighted signal components includes contributions from the selected symbol period and symbols from a number of other symbol periods that occur before and after the selected symbol period. The multi-symbol analysis process allows more extensive digital filtering, which reduces the bandwidth required to achieve the signal to noise ratio necessary to determine correctly a digital symbol represented by an analog signal. As a result, the multi-symbol analysis process can markedly increase the capacity of communications channels, including satellite communication channels. In the course of the multi-symbol analysis process a quality factor is produced that can be related directly to the probability of error in that decision. This provides an efficient means of error correction with a minimum use of additional bandwidth.

24 Claims, 4 Drawing Sheets

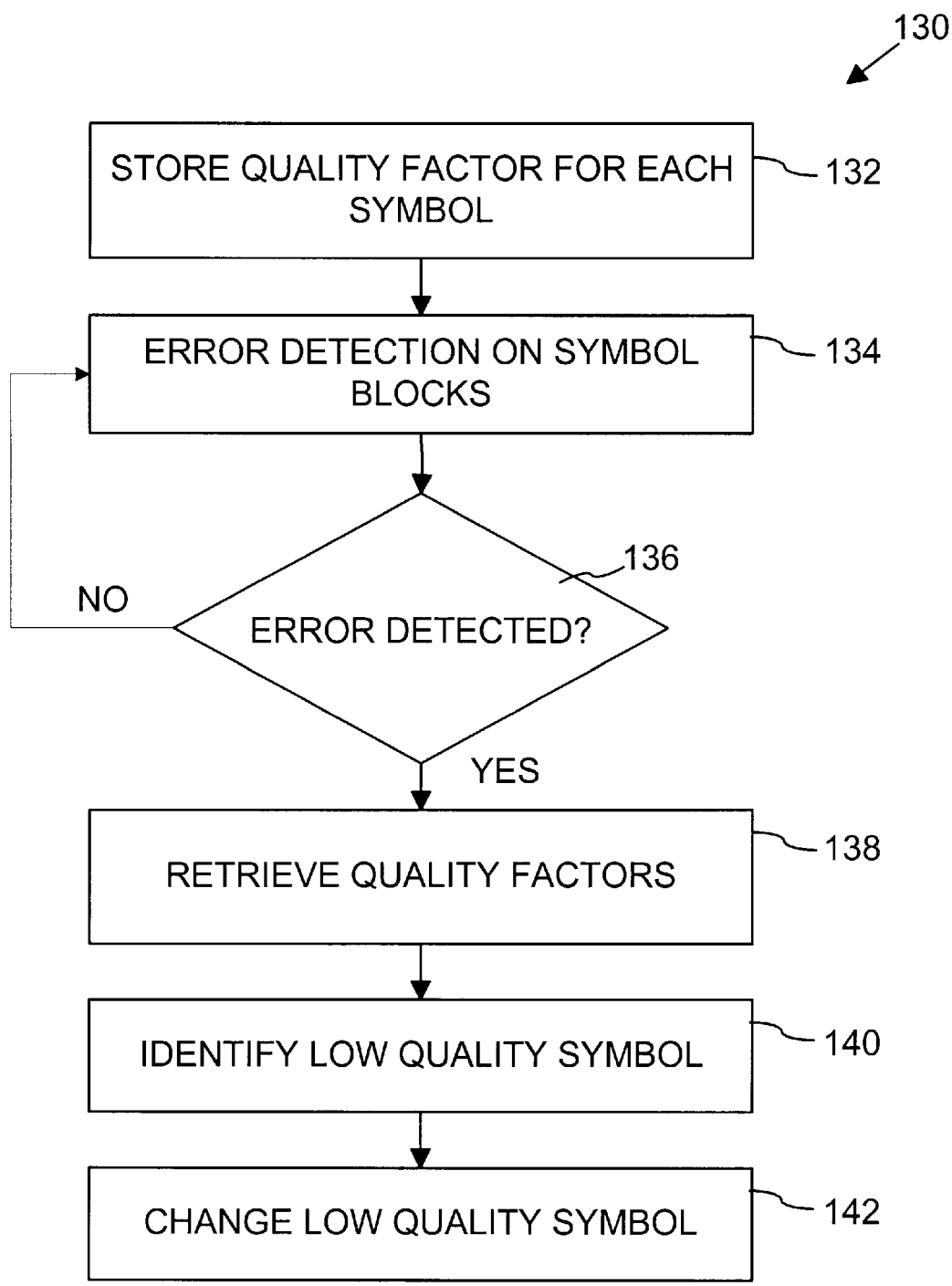

MULTI-SYMBOL ANALYSIS FOR DIGITAL SYMBOL DETERMINATION

FIELD OF THE INVENTION

This invention relates to digitization of analog communication signals and in particular to increasing the accuracy of digital symbol determinations to allow greater signal filtering and hence increased communication channel capacity.

BACKGROUND AND SUMMARY OF THE INVENTION

A conventional communication signal processor receives a modulated signal (e.g., FM, PM, FSK) that is mixed and demodulated to produce an analog voltage signal. During demodulation, or immediately following it, a bandwidth limiting filter is applied. The filtered, analog voltage signal is then converted to digital form by integrating the signal and comparing it to a threshold voltage to produce a digital signal. Integrated signal voltages within selected voltage ranges are assigned corresponding digital magnitudes (e.g., binary magnitudes). The assignment of a digital magnitude is referred to as a bit or symbol decision.

In all electronic communications, it is desirable to transmit information on narrow bandwidths at low power. Frequency filtering narrows the bandwidth of a communication signal. In high capacity communications, many communication signals are carried within a given frequency allocation or channel. Increasing the degree of filtering of each signal on the channel (i.e., narrowing the bandwidth of each signal) increases the number of separate signals that the channel can carry (i.e., the channel capacity). In high capacity communications, including satellite communications, increases in the capacity of communication channels are extremely valuable. The problem is that increasing the degree of bandwidth narrowing by signal filtering decreases signal integrity due to inter-symbol interference. In inter-symbol interference, the signal that represents a digital symbol during a given symbol period is in effect contaminated with signal components from other symbol periods.

A multi-symbol analysis process of the present invention compensates for inter-symbol interference. The multi-symbol analysis process allows more narrow bandwidth digital filtering, which reduces the bandwidth required to correctly determine a digital symbol represented by an analog signal for a given signal to noise ratio. As a result, the multi-symbol analysis process can markedly increase the capacity of communications channels, including satellite communication channels.

The multi-symbol analysis process determines a digital value for a symbol represented by a selected symbol period by correlating a digitized sample within and outside the selected symbol period with a sum of weighted signal components. The sum of weighted signal components includes contributions from the selected symbol period and symbols from a number of other symbol periods that occur before and after the selected symbol period.

The symbol decision process also determines a quality factor of the symbol decision which may be used in error correction. When an error is detected in a group of symbols using, for example, conventional error detection techniques, the quality factor dictates the correction to the symbol. In a group of binary symbols, the quality factor can indicate the bit that is most likely erroneous and thus most eligible for correction. In multi-level symbols, the quality factor can likewise indicate which symbol is most eligible for correction and also the direction of correction, that is, whether the symbol value should be increased or decreased.

Additional objects and advantages of the present invention will be apparent from the detailed description of the preferred embodiment thereof, which proceeds with reference to the accompanying drawings.

BRIEF DESCRIPTION OF THE DRAWINGS

FIG. 5 is a flow diagram of a quality factor based error correction process.

DETAILED DESCRIPTION OF PREFERRED EMBODIMENTS

Figure 1:
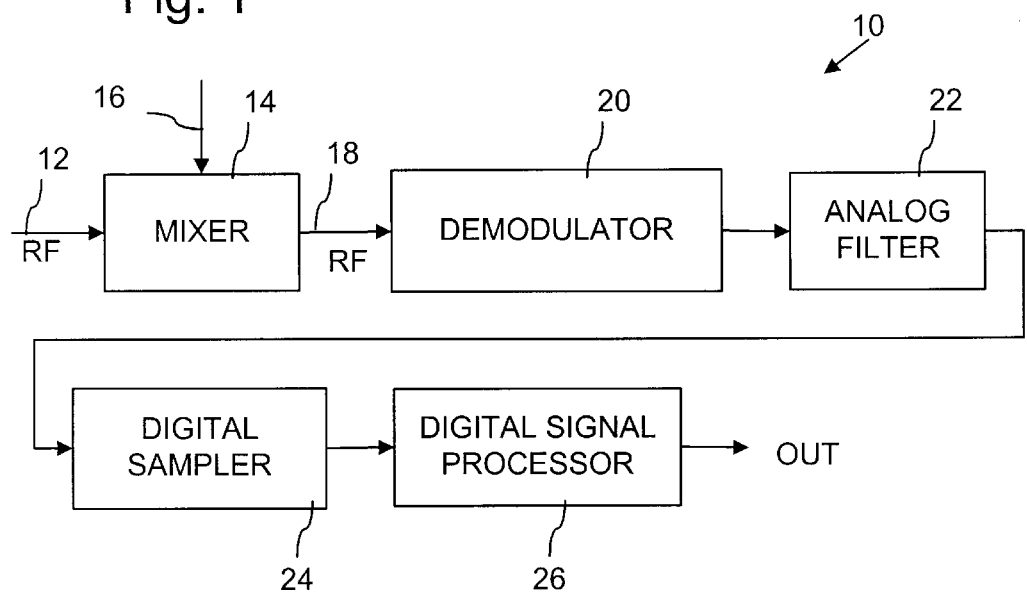
FIG. 1 is a block diagram of a signal processor that employs a multiple symbol analysis process for determining digital symbols in an analog signal.

FIG. 1 is a block diagram of a signal processor 10 that employs a multiple symbol analysis process for determining symbols (e.g., digital magnitudes) in a digitized signal. The multiple symbol analysis process determines each symbol with reference to digitized signal samples corresponding to the symbol being determined, as well as other adjacent symbols.

Signal processor 10 includes an input 12 that receives a radio frequency (RF) signal and delivers it to a mixer 14, which mixes the RF signal with a carrier reference signal at an input 16 to provide an analog intermediate frequency (IF) signal at a mixer output 18. A demodulator 20 demodulates the IF signal and passes it to a fixed broadband filter 22. A digital sampler 24 receives the filtered analog signal and generates digitized samples of it. The digitized samples represent the amplitude of the analog signal value (i.e., voltage) at a particular instant in time. The digitized samples are delivered to a digital signal processor (DSP) 26 that performs digital filtering, symbol determinations based upon a multi-symbol analysis and, optionally, error detection and correction.

Figure 2:
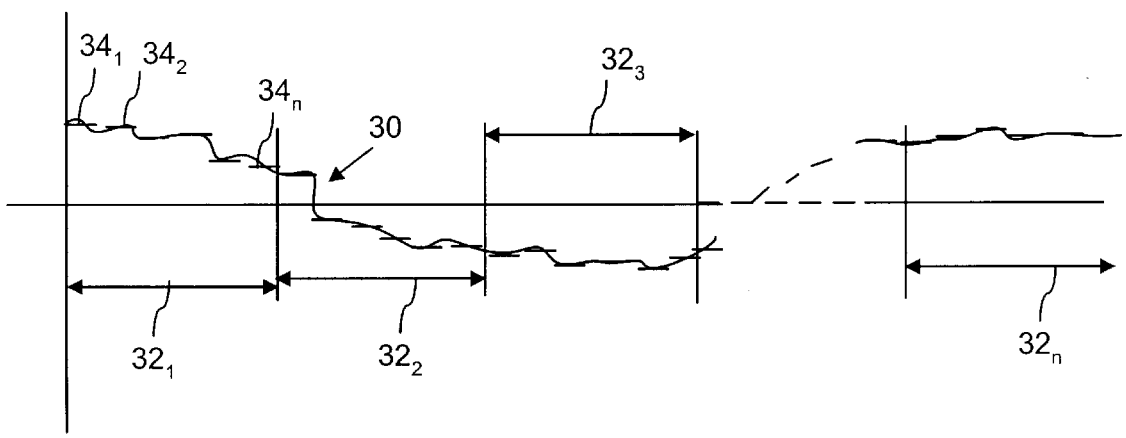
FIG. 2 is an illustration of a simplified filtered analog voltage signal and its corresponding digital signal processing elements.

FIG. 2 is an illustration of a simplified filtered analog voltage signal 30 and its corresponding digital signal processing elements. Analog voltage signal 30 represents a serial stream of symbol periods $32_1, 32_2, \ldots, 32_n$, that represent corresponding digital symbols. Within each symbol period 32, digital sampler 24 generates m-number of digitized samples $34_1, 34_2, 34_m$. Each digital symbol represented by a symbol period 32 corresponds to one of multiple digital magnitudes. In the simplest implementation, which is illustrated here, the digital signal is binary and the digital symbols may each take on one of two digital values. The present invention is applicable, however, to digital information with an arbitrary number of magnitude levels. The function of digital signal processor 26 is to determine one digital value for each symbol 32 from multiple digitized samples 34 generated by digital sampler 24.

When a signal is digitally sampled at a rate of X samples per second, the maximum frequency that can be represented by the digital version of the signal is X/2 Hz. This is Nyquist's theorem, and X/2 is the Nyquist frequency. Analog signal components at frequencies above the Nyquist frequency can cause artifacts or aliasing in signals below the Nyquist frequency. Fixed filter 22 eliminates signal components above the filter cutoff frequency F Hz, where F is chosen to be at or below the Nyquist frequency to prevent aliasing.

Digital sampler 24 generates m-number of samples 34 per symbol period 32. With a symbol rate R that is the inverse of the symbol period 32:

$$X=mR.$$

Thus, for a given symbol rate R and fixed filter 22 with cutoff frequency F, the number of samples per symbol m must be chosen so as to satisfy $X/2 \geq F$. Alternatively, fixed filter 22 may be selected to permit a desired sample rate m.

The digital filtering provided by digital signal processor 26 may be adjusted during signal processing. Thus, the bandwidth allocated to a particular user or channel may be varied quasi-continuously and dynamically in real time up to the value imposed by fixed filter 22. In high capacity communications, including satellite communications, dynamic allocation of bandwidth significantly increases satellite capacity as it allows scarce satellite resources, e.g. power, to be reallocated according to demand.

In all electronic communications, it is desirable to transmit information on narrow bandwidths at low power. Frequency filtering narrows the bandwidth of a communication signal. In high capacity communications, many communication signals are carried on a single channel. Increasing the degree of filtering of each signal on the channel (i.e., narrowing the bandwidth of each signal) increases the number of separate signals that the channel can carry (i.e., the channel capacity). In high capacity communications, including satellite communications, increases in the capacity of communication channels are extremely valuable. The problem is that increasing signal filtering decreases signal integrity due to inter-symbol interference. In inter-symbol interference, the signal during a given symbol period 32 is in effect contaminated with signal components from other symbol periods. The effect of this contamination may be represented by the Fourier transform of the filter function.

Figure 3:
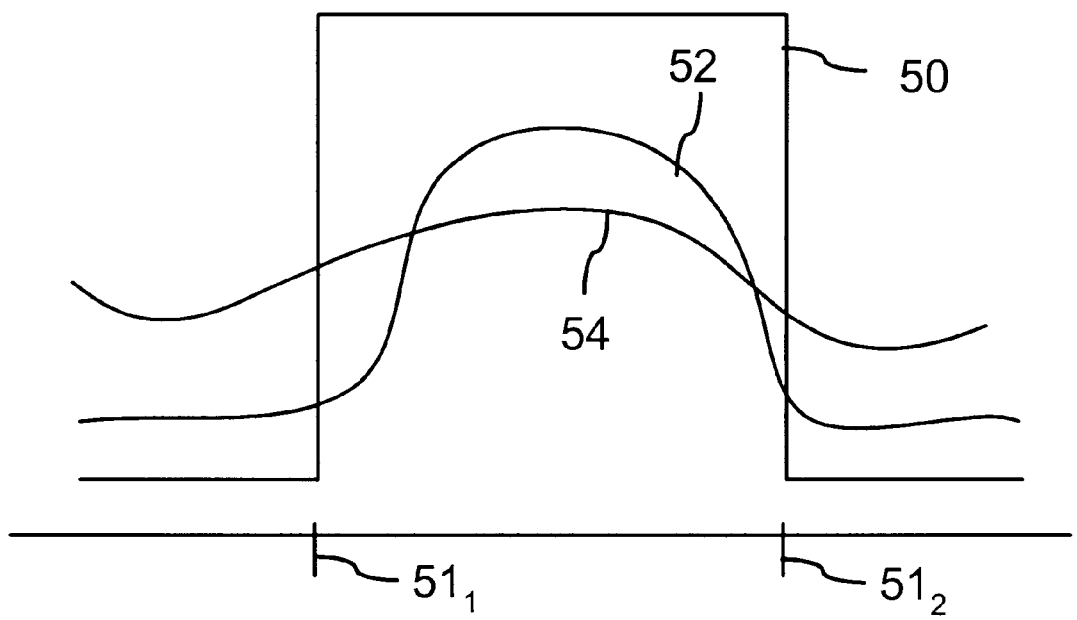
FIG. 3 is an illustration of signal integrity relative to increased amounts of filtering.

FIG. 3 is an illustration of signal integrity relative to increased amounts of filtering. Waveform 50 represents an exemplary square wave signal over one period, time $51_1$ to $51_2$ with no filtering (i.e., all frequency components of the signal are present). Waveform 52 represents the same square wave signal with a first amount of bandpass filtering. Waveform 54 represents the square wave signal with a second amount of bandpass filtering that is greater than the first amount. Waveforms 52 and 54 illustrate the loss of the distinctiveness of waveform 50 with increased filtering and the spread of signal power from 50 outside the time period $51_1$ to $51_2$.

This loss of distinctiveness corresponds to a decreased signal-to-noise ratio that introduces uncertainty and errors in determining the symbols in an analog signal. Digital signals may be one-bit (i.e., binary with two possible symbols) or multi-bit (e.g., 2,3,4 or more bits corresponding to 4, 8, 16, or more symbol levels). It will be appreciated that such decreased signal-to-noise ratios for digital signals of increasing numbers of bits are particularly disadvantageous because of the decreasing differences between adjacent symbol levels.

Figure 4:
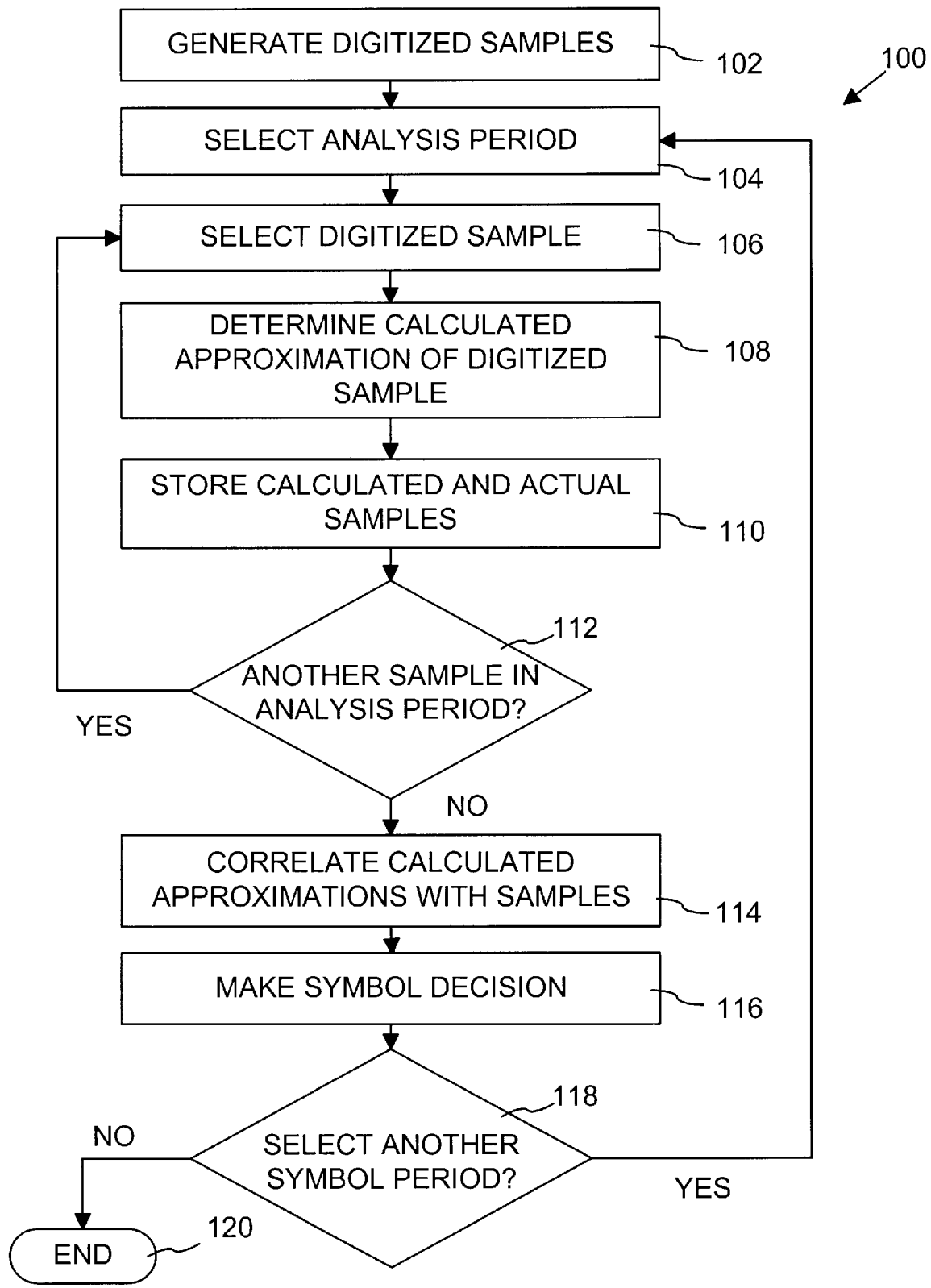
FIG. 4 is a flow diagram of a multi-symbol analysis process.

FIG. 4 is a flow diagram of a multi-symbol analysis process 100 that is performed within digital signal processor 26, in this implementation, to determine one digital value from the multiple digitized samples 34 generated by digital sampler 24 during each symbol period 32. As is known in the art, a digital signal processor such as processor 26 is a specialized computer that operates according to software instructions. Multi-symbol analysis process 100 is an implementation of such software instructions (which are stored in a computer readable medium) in digital signal processor 26.

Multi-symbol analysis process 100 compensates for inter-symbol interference. As a result, multi-symbol analysis process 100 allows more bandwidth narrowing digital filtering, which reduces the bandwidth required to achieve the signal to noise ratio necessary to determine correctly a digital symbol represented by an analog signal. As a result, multi-symbol analysis process 100 can markedly increase the capacity of communications channels, including satellite communication channels.

Multi-symbol analysis process 100 determines a digital value for a symbol represented by symbol period $32_0$ by comparing n-number of digitized samples $34_i$ within and adjacent to the symbol period $32_0$ with a sum of weighted signal components. The sum of weighted signal components includes contributions from the symbol period $32_0$ and contributions from other symbol periods before and after the symbol period $32_0$.

Process block 102 indicates that multiple digitized samples 34 are generated for each of multiple symbol periods 32 in an analog signal representing a digital signal. Digitized samples 34 are in the form of discrete integer values corresponding to the amplitude of the analog signal.

Process block 104 indicates that an analysis period that contains n-number digitized samples 34 is selected to determine a digital value for a symbol period $32_0$. The analysis period is the time corresponding to n-number digitized samples centered about the symbol period $32_0$. The choice of number of samples n to include in the analysis depends on the extent and nature of the filtering. The number of samples used in the analysis can be no more than $m*(2j+1)$ and will generally be substantially less than this as the samples in the j and -j symbol periods are significantly influenced by symbols outside the region of interest.

Process block 106 indicates that a digitized sample $34_i$ is selected.

Process block 108 indicates that a calculated approximation of digitized sample $34_i$ is determined. The calculated approximation of digitized sample $34_i$ is based upon the following expression:

$$S_{cal,i} = a_{-j}B_{-j,i} + a_{-j+1}B_{(-j+1),i} + \ldots a_0 B_{0,i} \ldots + a_{j-1}B_{(j-1),i} + a_j B_{j,i}$$

Where:

$S_{cal,i}$=expected value of digitized sample $34_i$ within symbol period $32_0$;

$B_j$=contribution (or weight) of a symbol of amplitude 1 located j symbol periods away;

$a_j$=coefficients representing the value or magnitude of the symbol in symbol period j.

The observed digitized sample is related to the calculated sample by $$S_{obs,i} = S_{cal,i} + \epsilon_i$$

where $\epsilon_i$ includes contributions from noise at that particular time sample and errors in the approximate expression for $S_{cal}$.

This expression characterizes the analog value of digitized sample $34_i$ as the sum of weighted contributions from the magnitude of the symbol $a_0$ being determined, approximations of the inter-symbol interference from other symbols (e.g., $a_{-j}$, $a_{-j+1}$, $a_{j-1}$, $a_j$) and noise. The approximation of digitized sample $34_i$ may be calculated efficiently due to a priori determination of the weighting factors B and the magnitudes of at least some of the other symbols and because adequate performance can be achieved even when contributions from relatively few other symbols are considered. A value of j=1 or j=2 has proved to be generally adequate with values of j=3 or j=4 providing only small gains at the expense of substantially longer computation.

The weighting factors $B_j$ are largely determined by the digital filtering provided by digital signal processor 26. Digital filtering can be directly calculated to a good approximation by passing an ideal symbol pulse through the appropriate numerical filters, as is known in the art. The weighting factors $B_j$ can also be determined empirically by applying an impulse input signal to the receiver or the digital filter. This could entail a short training period when an exchange was initiated and would have the benefit of including the overall system response. In practice, if the bandwidth determined by the digital filtering of digital signal processor 26 is reasonably narrow compared to fixed analog filters 22, a very good estimate of $B_j$ could be made numerically. In another implementation the weighting factors $B_j$ could be modified continuously using feedback from quality factors or an error correction stage, described below.

Process block 110 indicates that the calculated approximation for the current sample $S_{cal,i}$ and the corresponding actual or observed sample $S_{obs,i}$ are stored.

Query block 112 represents an inquiry as to whether another sample within the selected analysis period is to be selected. Whenever another sample within the selected symbol period is to be selected, query block 112 returns to process block 106. Whenever another sample within the selected symbol period is not to be selected, query block 112 proceeds to process block 114.

Process block 114 compares the calculated approximation for the current sample $S_{cal,i}$ with the corresponding actual or observed sample $S_{obs,i}$ and combines the result for the sample i with the other samples in the analysis period to make a correlation. The values of the parameters $a_j$ are determined as those that best represent the data over the analysis period. The correlation used to determine which set of $a_j$ best represent the data may take a variety of forms including:

weighted least squares in which the sum of the squares of the residuals, Y, is minimized:

$$Y = \sum_{i=1}^{n} w_i (S_{obs,i} - S_{cal,i})^2$$

maximum entropy in which the best answer maximizes the entropy function Y:

$$Y = \sum_{i=1}^{n} -(S_{obs,i} - S_{cal,i}) * \log|(S_{obs,i} - S_{cal,i})|$$

myriad weighting in which the best answer minimizes the function Y where $X_{my}$ is an arbitrary constant chosen to reflect the nature of the noise:

$$Y = \prod_{i=1}^{n} (X_{my} + w_i * (S_{obs,i} - S_{cal,i})^2)$$

There are small differences in performance between these schemes with the optimum depending on the degree of filtering and nature of the noise. For Gaussian white noise and filtering near to the Nyquist limit the weighted least squares has given good performance. The choice of weighting scheme, $w_i$ depends on the nature of the noise and filtering. For Gaussian white noise a weight proportional to $B_{0,i}$ is preferred, as is known in the art. Specifically, Guassian noise is independent of the signal and so has a signal to noise ratio that is directly proportional to the signal magnitude. The magnitude of the signal of interest at any particular sample is $B_{0,i}$, hence the weighting suggested. It may be that in some cases the noise is caused by instability in the signal itself, in which case the optimum weight could well be related to the square root of $B_{0,i}$, for example.

By way of example, let the symbol magnitude be binary and select j=2. Then the calculated approximation of a particular digitized sample is represented as:

$$S_{0,i} = a_{-2}B_{-2,i} + a_{-1}B_{-1,i} + a_0B_{0,i} + a_1B_{1,i} + a_2B_{2,i}$$

The estimated symbol determination may be made for symbol period $a_0$ in the following manner. Except for initial conditions, symbols $a_{-2}$ and $a_{-1}$ would have been determined previously and hence are known a priori to the estimated symbol determination for $a_0$. At initial conditions before symbols $a_{-2}$ or $a_{-1}$ are determined, those factors are dropped from the calculation. In the illustrated implementation with j=2, for example, $S_i$ is represented by a sum of three remaining symbol values: $a_0B_0$, $a_1B_1$, and $a_2B_2$. Only the symbol magnitudes $a_0$, $a_1$, and $a_2$ remain unknown. With binary magnitudes the three unknown symbol magnitudes $a_0$, $a_1$, and $a_2$ may assume only eight different combinations of values. The estimated symbol determination for symbol period $a_0$ is made as the $a_0$ magnitude that, in combination with $a_1$ and $a_2$ magnitudes, provides the best value for a selected function Y across the analysis period. The use of a priori knowledge from previous bit decisions may be extended by iteration of multi-symbol process 100. On the second pass through process 100 all symbols other than the one under consideration are treated as known and are used to correct the inter-symbol interference in the symbol period $32_0$. This would allow the coefficients of symbols following $a_0$, i.e. $a_1$, $a_2$... as well as the coefficients $a_{-j}$ and $a_{-j+1}$... to be kept fixed when $a_0$ is being determined. The small improvement in decision accuracy may well not offset the increased computational time required for a second iteration of process 100.

Process block 116 indicates that the symbol decision for the symbol period $32_0$ is made by comparing the value $a_0$ to a set of one or more thresholds. For a binary symbols there will be a single threshold separating the two possible outcomes. For multi-level signals a set of thresholds are used and can be dynamically adjusted on the basis of the success of previous decisions. For complex coding schemes that introduce correlation between sequential signals the bit decision process can restrict the feasible decisions on the basis of previous symbol decisions.

Query block 118 represents an inquiry as to whether there is another symbol period to be selected. Whenever there is another symbol period to be selected, query block 118 returns to process block 104. Whenever there is not another symbol period to be selected, query block 118 proceeds to termination block 120.

The multi-symbol analysis is a linear regression calculation. Thus, the regression can be carried out with equal success in frequency space. For this implementation the $2j_{+}1$ symbols are Fourier transformed to produce a frequency spectrum of the signal and the coefficients $a_j$ evaluated using this transformed signal. The functions $B_j$ are based on the Fourier transform representation of the response of the digital filter to an input pulse that has been appropriately phased. It is noted that this implementation could be carried out simultaneously with the application of the digital filter.

Multi-symbol analysis process 100 is applicable to binary and multi-level signals and to arbitrarily complex coding schemes. This allows the signal scheme to be adjusted dynamically to optimize use of system resources. The numbers of digitized samples taken, the number of symbol periods to include in each calculated approximation, and the number of calculated approximations for each symbol period can be dynamically varied to match bandwidth/noise/filter combinations. The symbol decision process includes the effects of multiple symbols in the signal stream both prior to and after the symbol period of interest to account for inter-symbol interference. This permits the use of a greater number of narrow bandwidth signals, where inter-symbol interference is likely present, and makes a symbol decision without altering the signal to reduce or eliminate the effect of inter-symbol interference.

Multi-symbol analysis process 100 is described as a single pass implementation in which each symbol determination (e.g., for each $a_0$) remains fixed once made. In another implementation, multi-symbol analysis process 100 is repeated at least once using all the prior knowledge and in which symbol determinations are allowed to change in turn. This implementation accommodates circumstances in which, for example, a symbol determination for symbol magnitude $a_0$ is based on a set of unknown symbol magnitudes $a_0$, $a_1$ and $a_2$, and the subsequent determination of $a_1$ or $a_2$ assigns a different value to that symbol than the value used to determine $a_0$.

Another aspect of the present invention is that a quality factor, which is indicative of quality of the symbol decision, is determined during the symbol decision process. The quality factor may be used during error correction to the best correction to the most likely erroneous symbol as part of a quality factor error correction process. The quality factor error correction process uses information available in a sampled signal stream when a symbol decision is made to provide enhanced error correction. The quality factor information is passed from a symbol decision system or process to an error detection/correction system or process and can be any value or set of values that relate to the probability of a decision being correct. In one implementation a quality factor can be calculated as the difference between the observed symbol value and the symbol decision threshold.

The statistical properties of the quality factor, e.g. it standard deviation, can also be used to predict with reasonable accuracy the overall bit error rate of the signal stream. This prediction is possible prior to the occurrence of any decision errors and does not require the detection or correction of decision errors. The ability to estimate bit error rates prior to the detection of any error may provide a useful additional tool for the dynamic management of system resources.

FIG. 5 is a flow diagram of an error correction process 130 that utilizes quality factors that indicate the quality or probability of correctness of the symbol determinations made in process 100. An aspect of error correction process 130 is that the quality factor information is used to convert error detection to error correction for a set number of symbols (i.e., a block) without the need for additional redundant symbols in the signal stream.

Process block 132 indicates that a quality factor is stored in association with each symbol decision in a block of symbols. In one implementation a quality factor can be calculated as the difference between the observed symbol value and the symbol decision threshold.

Process block 134 indicates that error detection is performed on the digital symbols. The error detection may be performed by standard error detection methods. In one implementation, parity checking error detection is performed on blocks of digital symbols. Each data block includes a parity bit. For example, a binary system with a bit block of ten symbols or bits could include 9 data bits and 1 parity bit.

Query block 136 represents an inquiry as to whether an error is detected. Whenever an error is detected, query block 136 proceeds to process block 138. Whenever an error is not detected, query block 136 returns to process block 134 for subsequent digital symbols (e.g., the next successive block).

Process block 138 indicates that the quality factors of the digital symbols in the block are retrieved.

Process block 140 indicates that the digital symbol with the poorest quality factor is identified as the low quality digital symbol in the block. The low quality digital symbol is considered to be the symbol with the highest probability of error.

Process block 142 indicates that the magnitude of the low quality digital symbol in the block is changed to it next most likely magnitude. In binary systems wherein a symbol corresponds to a bit, the bit is simply inverted, a 1 becomes a 0. In a multi level system the symbol is changed between two adjacent signal levels and according to whether the quality indicates a positive or a negative difference. In one implementation, a negative quality factor indicates that the determined symbol magnitude is less than the relevant threshold, and a positive quality factor indicates the determined symbol magnitude is greater than the relevant threshold. The erroneous symbol is changed to the closest magnitude other than the magnitude that was previously assigned.

The failure mode when an error is detected but not successfully corrected is to increase the number of errors in the block by 1. This basic implementation therefore creates a non-statistical distribution of errors (i.e. only even numbers of errors) that could affect subsequent error correction procedures that assume random error distributions.

In this simple parity detection implementation only one error is present in the majority of blocks with an odd number of errors, and in most cases blocks will have at most one error. Errors are not detected and hence not corrected by this simple parity detection implementation in blocks with an even number of errors.

If additional error correction is desired, then a further conventional forward error correction (FEC) procedure may be applied to the data. When a conventional FEC method that is susceptible to bunching of errors is applied sequentially with error correction process 130, the symbols must be interleaved between blocks to recreate a pseudo-random error distribution. However, better error correction may be achieved if the quality factor information is directly integrated with additional (conventional) FEC procedures rather than used sequentially. This could be implemented by using the quality factor information to detect the main failure modes of the FEC procedure, or in an iterative fashion with suitable interleaving.

This specification sets forth the best mode for carrying out the invention as known at the time of filing the patent application and provides sufficient information to enable a person skilled in the art to make and use the invention. The specification further describes materials, shapes, configurations and arrangements of parts for making and using the invention. However, it is intended that the scope of the invention shall be limited by the language of the claims and the law of the land as pertains to valid U.S. patents.

In view of the many possible embodiments to which the principles of our invention may be applied, it should be recognized that the detailed embodiments are illustrative only and should not be taken as limiting the scope of our invention. For example, while the embodiments described are directed primarily to degradation in downlink communication signals, the present invention is similarly applicable to other types of downlink signals (e.g., control signals). Accordingly, the invention includes all such embodiments as may come within the scope and spirit of the following claims and equivalents thereto.

What is claimed is:

1. In a method of digitizing an analog communication signal, the method including determining a digital symbol represented by plural discrete samples of the analog communication signal in a selected one of plural symbol periods, the improvement comprising:

determining a calculated approximation for each of plural selected samples corresponding to the selected symbol period, each of the calculated approximations including a sum of weighted signal components from symbol periods other than the selected symbol period;

determining a correlation between the calculated approximations and the plural selected samples; and determining the digital symbol in the selected symbol period from the correlation between the calculated approximations with the plural selected samples.

2. The method of claim 1 in which each calculated approximation includes a weighted signal component from the selected symbol period.

3. The method of claim 1 in which the signal components include a digital symbol for at least one of the symbol periods.

4. The method of claim 1 in which the signal components include an estimated digital symbol for at least one of the symbol periods.

5. The method of claim 1 in which the signal components include a digital symbol for at least one of the symbol periods and an estimated digital symbol for at least one of the symbol periods.

6. The method of claim 1 in which correlating the calculated approximations with the plural selected samples includes minimizing differences between the calculated approximations with the plural selected samples.

7. The method of claim 1 in which determining a calculated approximation for each of plural selected samples is based upon the following expression:

$$S_{cal,i} = a_{-j}B_{-j,i} + a_{-j+1}B_{(-j+1),i} + \ldots a_0B_{0,i} \ldots + a_{j-1}B_{(j-1),i} + a_jB_{j,i}$$

where:

$S_{cal,i}$ = calculated value of digitized sample within the symbol period;

$B_j$ = contribution (or weight) of a symbol of amplitude 1 located j symbol periods away;

$a_j$ = coefficients representing the value or magnitude of the symbol in symbol period j; and the selected samples $S_{obs,i}$ are related to the calculated samples by $$S_{obs,i} = S_{cal,i} + \epsilon_i$$

where $\epsilon_i$ includes contributions from noise at that particular time sample and errors in the approximate expression for $S_{cal}$.

8. The method of claim 1 in which the digitizing of the analog communication signal includes digital filtering and the weighted signal components are weighted according to weighting factors that include inter-symbol signal components introduced by the digital filtering.

9. A method of digitizing an analog communication signal having a bandwidth and representing a digital symbol with plural discrete samples of the analog communication signal in a selected one of plural symbol periods, comprising:

filtering the communication signal to narrow its bandwidth, the filtering introducing inter-symbol interference that renders the digital symbol indeterminate from the plural discrete samples in the selected symbol period; and determining the digital symbol from plural selected samples corresponding to the selected symbol period, the plural selected samples including signal components from symbol periods other than the selected symbol period.

10. The method of claim 9 in which determining the digital symbol includes determining a calculated approximation for each of the selected samples, each of the calculated approximations including a sum of weighted signal components from symbol periods other than the selected symbol period.

11. The method of claim 10 in which determining the digital symbol includes determining a correlation between the calculated approximations and the plural selected samples.

12. The method of claim 10 in which each calculated approximation includes a weighted signal component from the selected symbol period.

13. The method of claim 10 in which the signal components include a digital symbol for at least one of the symbol periods.

14. The method of claim 10 in which the signal components include an estimated digital symbol for at least one of the symbol periods.

15. The method of claim 10 in which determining the digital symbol includes minimizing differences between the calculated approximations with the plural selected samples.

16. In a digital signal processor for digitizing an analog communication signal having a bandwidth and representing a digital symbol with plural discrete samples of the analog communication signal in a selected one of plural symbol periods, a computer readable medium having stored thereon software instructions, comprising:

software instructions for filtering the communication signal to narrow its bandwidth, the filtering introducing inter-symbol interference that renders the digital symbol indeterminate from the plural discrete samples in the selected symbol period; and software instructions for determining the digital symbol from plural selected samples corresponding to the selected symbol period, the plural selected samples including signal components from symbol periods other than the selected symbol period.

17. The medium of claim 16 in which the software instructions for determining the digital symbol includes software instructions for determining a calculated approximation for each of the selected samples, each of the calculated approximations including a sum of weighted signal components from symbol periods other than the selected symbol period.

18. The medium of claim 17 in which the software instructions for determining the digital symbol includes software instructions for determining a correlation between the calculated approximations and the plural selected samples.

19. The medium of claim 17 in which the software instructions for determining the digital symbol includes software instructions for minimizing differences between the calculated approximations with the plural selected samples.

20. In a method of digitizing an analog communication signal having a bandwidth and representing each of plural digital symbols with plural discrete samples of the analog communication signal in a selected one of plural symbol periods, a method of correcting errors in the digitized communication signal, comprising:

storing a quality factor in association with a determination of a digital symbol in each of plural selected symbol periods, each quality factor representing a relative quality of a corresponding determination of a digital symbol;

identifying a quality factor representing a lowest relative quality of a corresponding determination of a digital symbol of the plural selected symbol periods; and modifying the determination of the digital symbol with the quality factor representing the lowest relative quality to a next most likely determination.

21. The method of claim 20 in which the determination of each digital symbol includes determining the digital symbol from plural selected samples corresponding to the selected symbol period, the plural selected samples including signal components from symbol periods other than the selected symbol period.

22. The method of claim 21 in which the determination of each digital symbol includes determining a calculated approximation for each of the selected samples, each of the calculated approximations including a sum of weighted signal components from symbol periods other than the selected symbol period.

23. The method of claim 21 in which the determination of each digital symbol includes determining a correlation between the calculated approximations and the plural selected samples.

24. The method of claim 20 in which the determination of each digital symbol includes determining the digital symbol from plural selected samples corresponding to the selected symbol period and a calculated approximation for each of the selected samples and in which the quality factor in association with each determination of a digital symbol includes a difference between a selected sample and a symbol determination threshold.

* * * * *